US006493163B1

United States Patent
Reed et al.

(12) United States Patent
(10) Patent No.: US 6,493,163 B1
(45) Date of Patent: Dec. 10, 2002

(54) INCREASED LOCK RANGE PLL FOR CONSTRAINED DATA

(75) Inventors: David E. Reed, Westminster, CO (US); Trent Dudley, Littleton, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/518,111

(22) Filed: Mar. 3, 2000

(51) Int. Cl.$^7$ .................................................. G11B 5/09
(52) U.S. Cl. .......................................... 360/51; 360/46
(58) Field of Search .............................. 360/46, 51, 67, 360/26

(56) References Cited

U.S. PATENT DOCUMENTS

| | | |
|---|---|---|
| 5,696,639 A | 12/1997 | Spurbeck et al. |
| 5,726,818 A | 3/1998 | Reed et al. |
| 5,737,142 A | 4/1998 | Zook |
| 5,786,950 A | 7/1998 | Zook et al. |
| 5,909,332 A | 6/1999 | Spurbeck et al. |
| 5,917,668 A | 6/1999 | Behrens et al. |
| 5,926,490 A | 7/1999 | Reed et al. |
| 6,208,481 B1 * | 3/2001 | Spurbeck et al. .............. 360/46 |

FOREIGN PATENT DOCUMENTS

EP    0 793 365   *  3/1997  ............. H04L/7/02
EP    0 805 447 A2   5/1997

* cited by examiner

Primary Examiner—David Hudspeth
Assistant Examiner—Varsha A. Kapadia

(57) ABSTRACT

A disk drive system is disclosed that includes a disk device coupled to control circuitry. The disk device transfers a read signal representing data to the control circuitry, where the control circuitry is configured to receive the read signal and convert it into a data signal. To convert the read signal, the control circuitry samples the read signal to generate read samples. The control circuitry interpolates the read samples using phase error data to generate a first interpolated sample and a second interpolated sample. To generate the phase error data, the control circuitry subtracts the second interpolated sample from the first interpolated sample to generate a first result. The control circuitry subtracts the first interpolated sample from the second interpolated sample to generate a second result. The control circuitry slices the second result to generate a third result. The control circuitry then multiplies the first result and the third result to generate the phase error data. The control circuitry uses the phase error data to precisely interpolate the read samples and synchronize the read samples with a detector clock. The control circuitry then detects the data signal from the read samples.

38 Claims, 6 Drawing Sheets

INCREASED LOCK RANGE PLL FOR CONSTRAINED DATA

BACKGROUND OF THE INVENTION

1. Field of the Invention

The invention is related to the field of disk drive systems, and in particular to a disk drive system with increased reliability resulting from an increased lock range in an I.T.R. circuit.

2. Statement of the Problem

FIG. 1 shows a disk drive system 100. The disk drive system 100 includes a disk device 102 connected to control circuitry 106. The disk device 102 includes storage media 104 that stores data. Some examples of the storage media 104 are magnetic and optical disks. The control circuitry 106 includes a read channel circuit 120 that processes signals from the disk device 102 to re-produce the stored data. The read channel circuit 120 includes a sampling circuit 122, an adaptive filter 124, an interpolated timing recovery (I.T.R.) circuit 126, a detector 128, and a decoder 130 all connected in series. The I.T.R. circuit 126 includes an interpolator 142 that is connected to the adaptive filter 124 and the detector 128. The I.T.R. circuit 126 also includes a phase error detector 144, a filter 146, and an accumulator 148 that are connected in series to form a phase lock loop 140 for the interpolator 142.

If the storage media 104 is a magnetic disk, then the data is exchanged with the magnetic disk as follows. A signal representing the data drives a magnetic head. The magnetic head alters a magnetic field to create magnetic transitions on the magnetic disk. These magnetic transitions represent the data. The head subsequently detects the magnetic transitions to generate a read signal 110. The read signal 110 represents the magnetic transitions. The read channel circuit 120 processes the read signal 110 to produce a data signal 131 that represents the data.

If the storage media 104 is an optical disk, then the data is exchanged with the optical disk as follows. A signal representing the data drives a device that creates pits in the surface of the optical disk. The pits create physical transitions that represent the data. An optical pick-up projects a laser onto the surface of the disk and detects the reflection to generate the read signal 110. The read signal 110 represents the physical transitions. The read channel circuit 120 processes the read signal 110 to produce a data signal 131 that represents the data.

To read the data, the magnetic head or optical pick-up must first be positioned over the transitions on the disk that correspond to the data. To facilitate this positioning, servo information that identifies various locations on the disk is stored on the disk at the corresponding locations. The read signal includes this servo information. The control circuitry 106 processes the servo information to control the positioning of the disk device 102.

The read channel circuit 120 operates as follows to convert the read signal 110 into the data signal 131. The sampling circuit 122 converts the read signal 110 from analog to digital by sampling the read signal 110 to generate read samples 123 for the adaptive filter 124. The adaptive filter 124 removes distortion by shaping the read samples 123 to generate equalized samples 125 for the I.T.R. circuit 126. The I.T.R. circuit 126 synchronizes the equalized samples 125 with the detector 128 clock by interpolating the equalized samples 125 at the detector 128 clock times to generate interpolated samples 127. The detector 128 converts the interpolated samples 127 into an encoded bit stream 129 by processing the interpolated samples 127 with a detection algorithm, such as a Viterbi state machine. The decoder 130 decodes the encoded bit stream 129 into the data signal 131 by applying a decoding technique, such as PR4 with D=1 constraints.

The I.T.R. circuit 126 operates as follows to synchronize the equalized samples 125 with the detector 128 clock. The interpolator 142 receives the equalized samples 125 from the adaptive filter 124. The interpolator 142 synchronizes the equalized samples 125 with the detector 128 clock by interpolating the equalized samples 125 at the detector 128 clock times to generate interpolated samples 127. In the phase lock loop 140, the phase error detector 144 receives the interpolated samples 127 and determines the phase error between the interpolated samples 127 and the detector 128 clock. The phase error detector 144 generates and transfers phase error data 145 to the filter 146. The filter 146 receives and filters the phase error data 145 to stabilize the phase lock loop 140. The filter 146 transfers the filtered phase error data 147 to the accumulator 148. The accumulator 148 receives and accumulates the filtered phase error data 147. The accumulator 148 transfers the accumulated phase error data 149 to the interpolator 142. The interpolator 142 uses the accumulated phase error data 149 from the phase lock loop 140 to more accurately synchronize the equalized samples 125 with the detector 128 clock. The I.T.R. circuit 126 configuration is a conventional phase lock loop 140 that is well known in the art. The interpolator 142, the filter 146, and the accumulator 148 are conventional components and for a more detailed description, refer to U.S. Pat. No. 5,909,332 entitled "Sampled Amplitude Read Channel Employing Interpolated Timing Recovery", which is hereby incorporated by reference into this application.

FIG. 2 depicts the phase error detector 144 within the I.T.R. circuit 126. The phase error detector 144 includes a first delay 210, a second delay 211, a slicer 220, a first multiplier 230, a second multiplier 231, and a subtractor 240. The phase error detector 144 generates phase error data 145 for the phase lock loop 140. The phase error data 145 allows the I.T.R. circuit 126 to more accurately synchronize the equalized samples 125 with the detector 128 clock.

The slicer 220 generates a binary output by comparing the input sample to a positive and,negative threshold. If the sample is above the positive threshold, then the output is a "1". If the sample is below the negative threshold, then the output is a "−1". If the sample is between the positive and negative thresholds, then the output is a "0".

The phase error detector 144 receives the interpolated samples 127 from the interpolator 142 including a current sample $y_0$ and a previous sample $y_1$. The slicer 220 slices the current sample $y_0$ to generate a current slice value $s_0$. The first multiplier 230 receives and multiplies the current slice value $s_0$ and the previous sample $y_1$ to generate a first result $s_0 y_1$. The first delay 210 stores the previous sample $y_1$ for the first multiplier 230. The first multiplier 230 transfers the first result $s_0 y_1$. The second multiplier 231 receives and multiplies the current sample $y_0$ and a previous slice value $s_1$ to generate a second result $s_1 y_0$. The previous slice value $s_1$ is the result of the slicer 220 slicing the previous sample $y_1$ as described above. The second delay 211 stores the previous slice value $s_1$ for the second multiplier 231. The second multiplier 231 transfers the second result $s_1 y_0$. The subtractor 240 receives the first result $s_0 y_1$ and the second result $s_1 y_0$, and subtracts the second result $s_1 y_0$ from the first result $s_0 y_1$ to generate a final result $s_0 y_1 - s_1 y_0$. The final result $s_0y_1-s_1y_0$ represents the phase error corresponding with the current sample $y_0$. The phase error detector 144 transfers the final result $s_0y_1-s_1y_0$ as the phase error data 145.

The performance of the phase lock loop 140 is characterized by a lock range. The lock range indicates the amount of phase error that can be corrected by the phase lock loop 140. When the phase error exceeds the lock range, the phase lock loop 140 operates as if there is no phase error. This results in a false lock where the phase lock loop 140 provides no correction despite the presence of significant phase error.

FIG. 3 depicts a lock range 300 of the I.T.R. circuit 126. The problem with the current I.T.R. circuit 126 is that the lock range 300 is too narrow and is susceptible to a false lock 310. The phase error data 145 increases in a linear relationship to the phase error over a certain range, called the lock range 300. When the phase error exceeds the lock range 300, the phase error detector 144 no longer transfers the correct phase error data 145. As the phase error further increases outside of the lock range 300, the I.T.R. circuit 126 experiences the false lock 310 meaning that the phase lock loop 140 provides no correction despite the presence of significant phase error. The phase error detector 144 appears to be generating correct phase error data 145 when it is not. Without the correct phase error data 145, the I.T.R. circuit 126 cannot properly synchronize the equalized samples 125 with the detector 128 clock. The narrow lock range 300 and the false lock 310 situation introduce errors into the disk drive system 100.

SUMMARY OF THE INVENTION

The invention solves the above problem by providing an improved disk drive system with control circuitry that has an increased dynamic lock range and does not create a false lock situation. By increasing the lock range and removing the false lock, the disk drive system converts the read signal into a data signal with fewer errors.

The disk drive system is comprised of a disk device coupled to control circuitry. The disk device transfers a read signal representing data to the control circuitry, where the control circuitry is configured to receive the read signal and convert it into a data signal. To convert the read signal, the control circuitry samples the read signal to generate read samples. The control circuitry interpolates the read samples using phase error data to generate a first interpolated sample and a second interpolated sample. To generate the phase error data, the control circuitry subtracts the second interpolated sample from the first interpolated sample to generate a first result. The control circuitry subtracts the first interpolated sample from the second interpolated sample to generate a second result. The control circuitry slices the second result to generate a third result. The control circuitry then multiplies the first result and the third result to generate the phase error data. The control circuitry uses the phase error data to precisely interpolate the read samples and synchronize the read samples with a detector clock. The control circuitry then detects the data signal from the read samples.

DETAILED DESCRIPTION OF THE INVENTION

Figure 4:
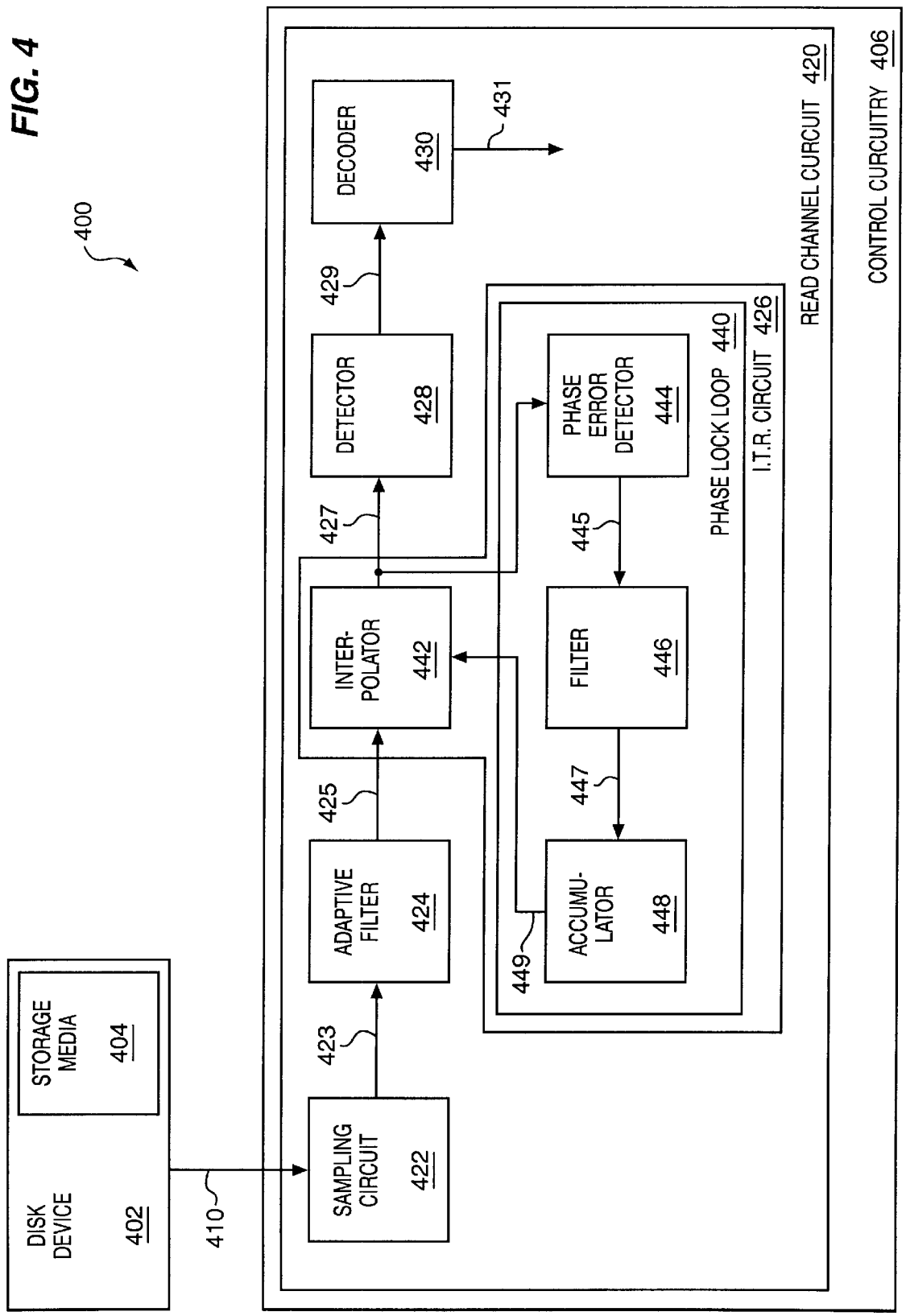
FIG. 4 is a block diagram that depicts a disk drive system in an example of the invention.
Figure 5:
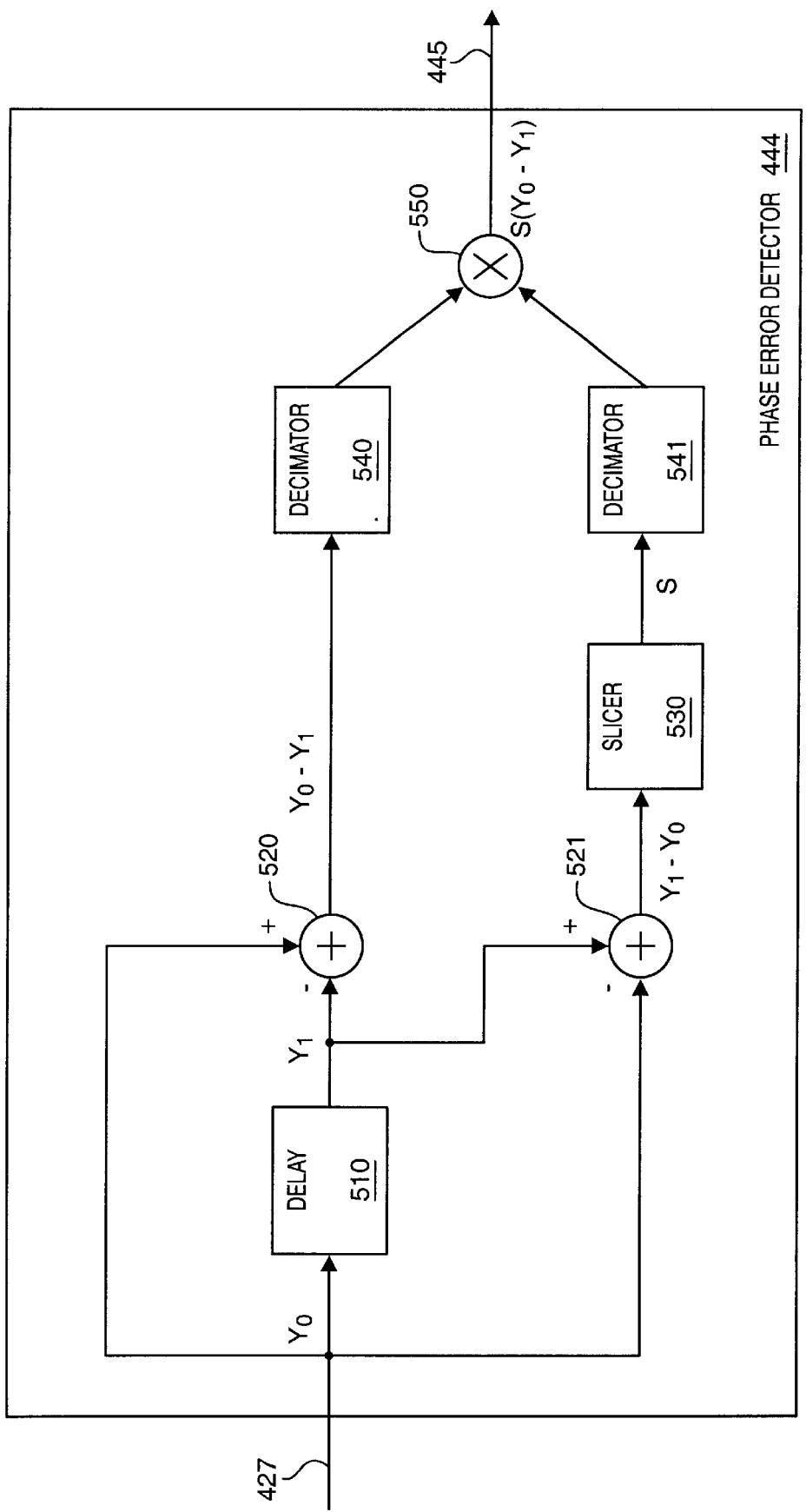
FIG. 5 is a block diagram that illustrates a phase error detector in an example of the invention.
Figure 6:
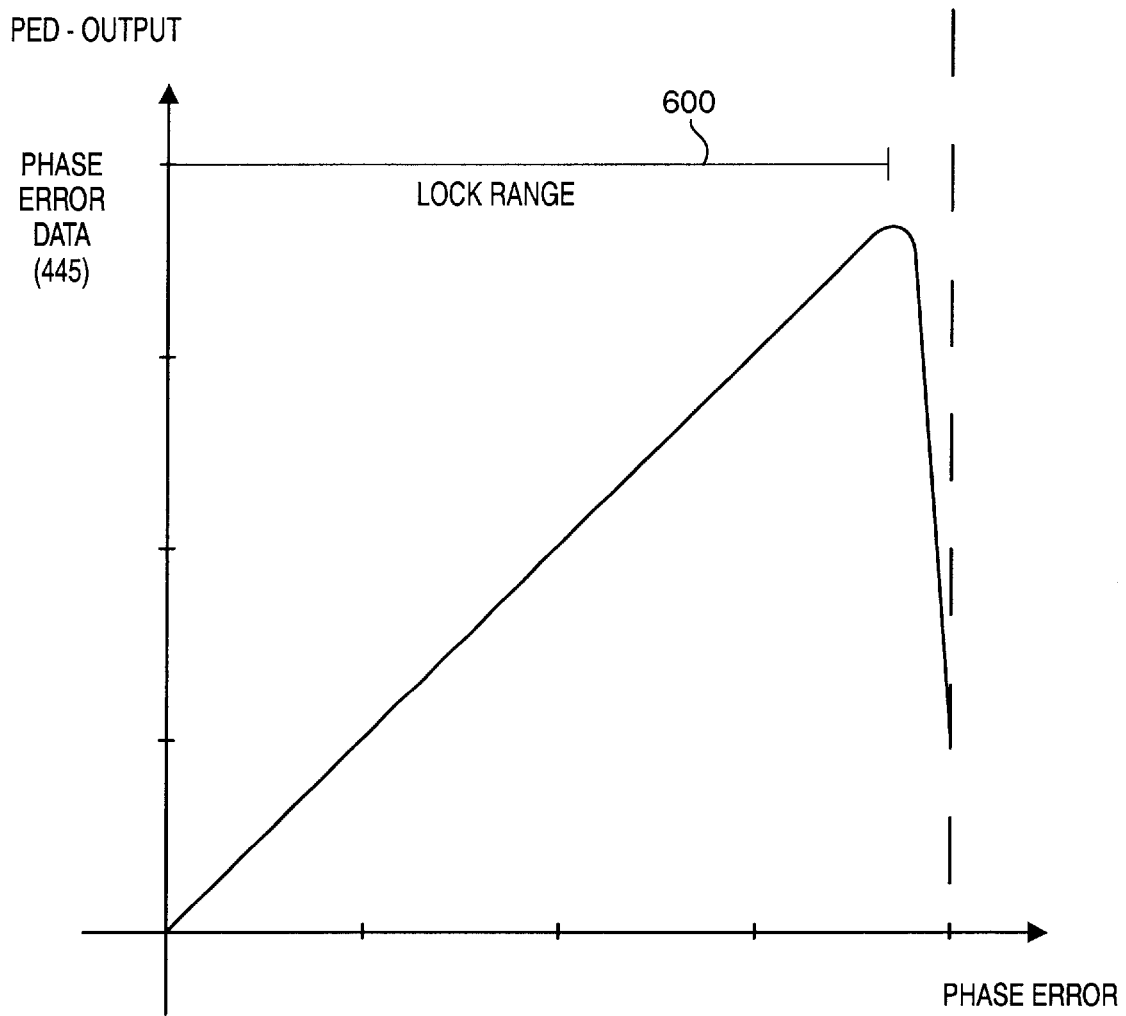
FIG. 6 is a graph depicting an example of the output of a phase error detector in an example of the invention.

Disk Drive System Configuration and Operation—FIGS. 4–6

FIG. 4 depicts a specific example of a disk drive system 400 in accord with the present invention. Those skilled in the art will appreciate numerous variations from this example that do not depart from the scope of the invention. Those skilled in the art will also appreciate that various features could be combined to form multiple variations of the invention.

FIG. 4 shows the disk drive system 400. The disk drive system 400 includes a disk device 402 connected to control circuitry 406. The disk device 402 includes storage media 404 that stores data. The control circuitry 406 includes a read channel circuit 420 that processes signals from the disk device 402 to re-produce the stored data. The read channel circuit 420 includes a sampling circuit 422, an adaptive filter 424, an interpolated timing recovery (I.T.R.) circuit 426, a detector 428, and a decoder 430 all connected in series. The I.T.R. circuit 426 includes an interpolator 442 that is connected to the adaptive filter 424 and the detector 428. The I.T.R. circuit 426 also includes a phase error detector 444, a filter 446 and an accumulator 448 that are connected in series to form a phase lock loop 440 for the interpolator 442. In a distinct advance in the art, the phase lock loop 440 of the I.T.R. circuit 426 in the read channel circuit 420 is configured to operate with an increased lock range and does not experience false lock. The improvements reduce the number of errors in the disk drive system 400.

The read channel circuit 420 operates as follows to convert the read signal 410 in the data signal 431. The sampling circuit 422 converts the read signal 410 from analog to digital by sampling the read signal 410 to generate read samples 423 for the adaptive filter 424. The adaptive filter 424 removes distortion by shaping the read samples 423 to generate equalized samples 425 for the I.T.R. circuit 426. The I.T.R. circuit 426 synchronizes the equalized samples 425 with the detector 428 clock by interpolating the equalized samples 425 at the detector 428 clock times to generate interpolated samples 427. The detector 428 converts the interpolated samples 427 into an encoded bit stream 429 by processing the interpolated samples 427 with a detection algorithm. The decoder 430 decodes the encoded bit stream 429 into the data signal 431 by applying a decoding technique.

The I.T.R. circuit 426 operates as follows to synchronize the equalized samples 425 with the detector 428 clock using a phase lock loop 440. The interpolator 442 receives the equalized samples 425 from the adaptive filter 424. The interpolator 442 synchronizes the equalized samples 425 with the detector 428 clock by interpolating the equalized samples 425 at the detector 428 clock times to generate interpolated samples 427. In the phase lock loop 440, the phase error detector 444 receives the interpolated samples 427 and determines the phase error between the interpolated samples 427 and the detector 428 clock. The phase error detector 444 generates and transfers phase error data 445. The filter 446 receives and filters the phase error data 445 to stabilize the phase lock loop 440. The filter 446 transfers the filtered phase error data 447 to the accumulator 448. The accumulator 448 receives and accumulates the filtered phase error data 447. The accumulator 448 transfers the accumulated phase error data 449 to the interpolator 442. The interpolator 442 uses the accumulated phase error data 449 from the phase lock loop 440 to more accurately synchronize the equalized samples 425 with the detector 428 clock.

FIG. 5 depicts a specific example of a phase error detector 444 in accord with the present invention. Those skilled in the art will appreciate numerous variations from this example that do not depart from the scope of the invention. Those skilled in the art will also appreciate that various features could be combined to form multiple variations of the invention.

The phase error detector 444 is comprised of a delay 510, a first subtractor 520, a second subtractor 521, a slicer 530, a first decimator 540, a second decimator 541, and a multiplier 550. The phase error detector 444 generates phase error data 445 for the phase lock loop 440. The phase error data 445 allows the I.T.R. circuit 426 to more accurately synchronize the equalized samples 425 with the detector 428 clock.

The phase error detector 444 receives the interpolated samples 427 from the interpolator 442 including a current sample $y_0$ and a previous sample $y_1$. The first subtractor 520 receives the current sample $y_0$ and the previous sample $y_1$. The delay 510 stores the previous sample $y_1$ for the first subtractor 520. The first subtractor 520 subtracts the previous sample $y_1$ from the current sample $y_0$ to generate a first result $y_0-y_1$. The first subtractor 520 transfers the first result $y_0-y_1$. The second subtractor 521 receives the current sample $y_0$ and the previous sample $y_1$. The delay 510 stores the previous sample $y_1$ for the second subtractor 521. The second subtractor 521 subtracts the current sample $y_0$ from the previous sample $y_1$ to generate a second result $y_1-y_0$. The second subtractor 521 transfers the second result $y_1-y_0$. The slicer 530 receives and slices the second result $y_1-y_0$ to generate a third result s. The slicer 530 transfers the third result s.

The first decimator 540 receives and decimates the first result $y_0-y_1$ to generate a first decimated result $y_0-y_1$. The first decimator 540 could be a conventional component. The first decimator 540 operates by removing some of the first result $y_0-y_1$ values. For example, the first decimator 540 could remove every other first result $y_0-y_1$ value, or the first decimator 540 could remove every third first result $y_0-y_1$ value. The second decimator 541 receives and decimates the third result s to generate a third decimated result s. The second decimator 541 operates as described above.

The multiplier 550 receives the first decimated result $y_0-y_1$ from the first decimator 540 and the third decimated result s from the second decimator 541. The multiplier 550 multiplies the first decimated result $y_0-y_1$ and the third decimated result s to generate a, final result $s(y_0-y_1)$. The final result $s(y_0-y_1)$ represents the phase error corresponding to the current sample $y_0$. The multiplier 550 transfers the final result $s(y_0-y_1)$ as the phase error data 445.

Figure 1:
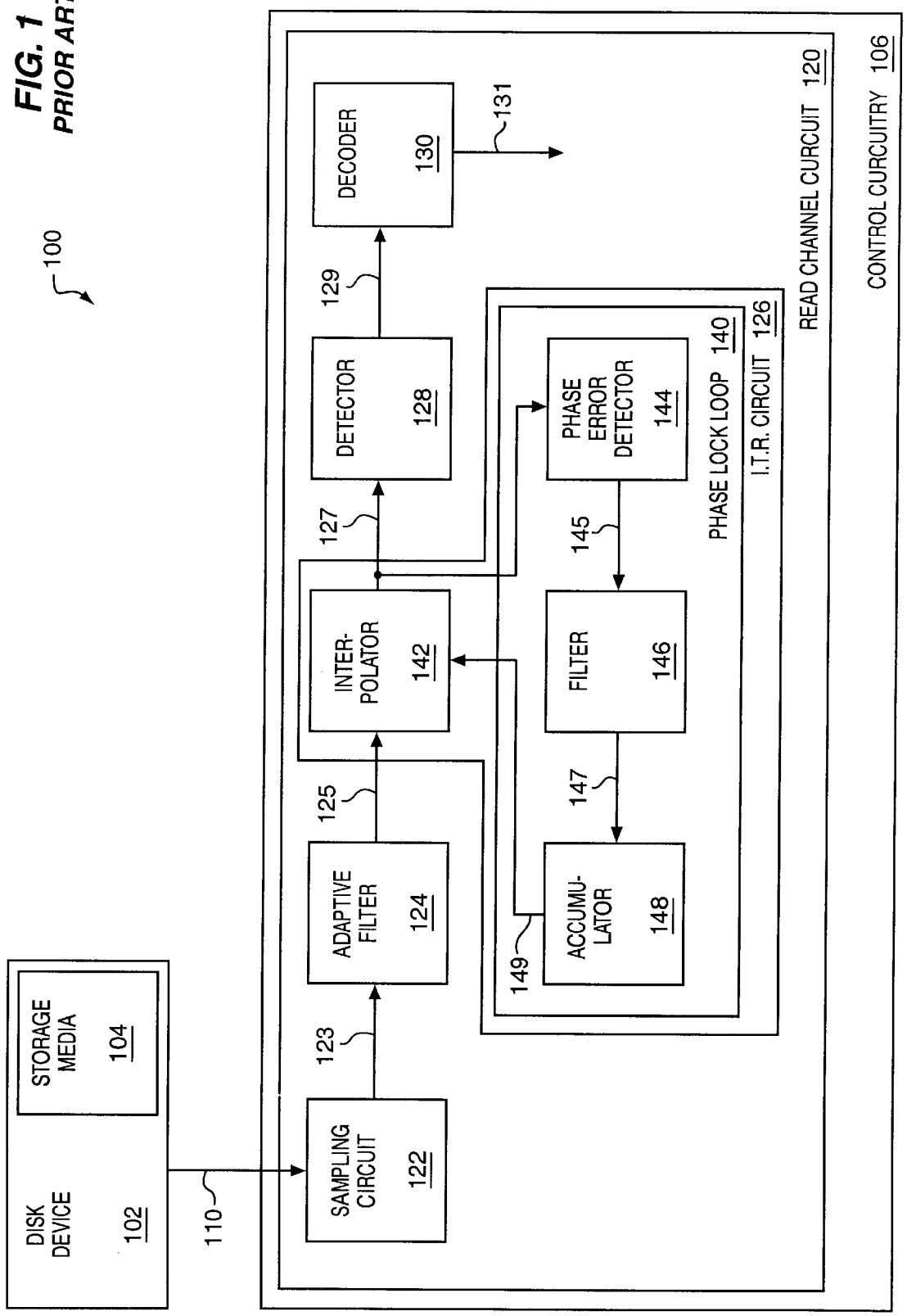
FIG. 1 is a block diagram that depicts a disk drive system in the prior art.
Figure 2:
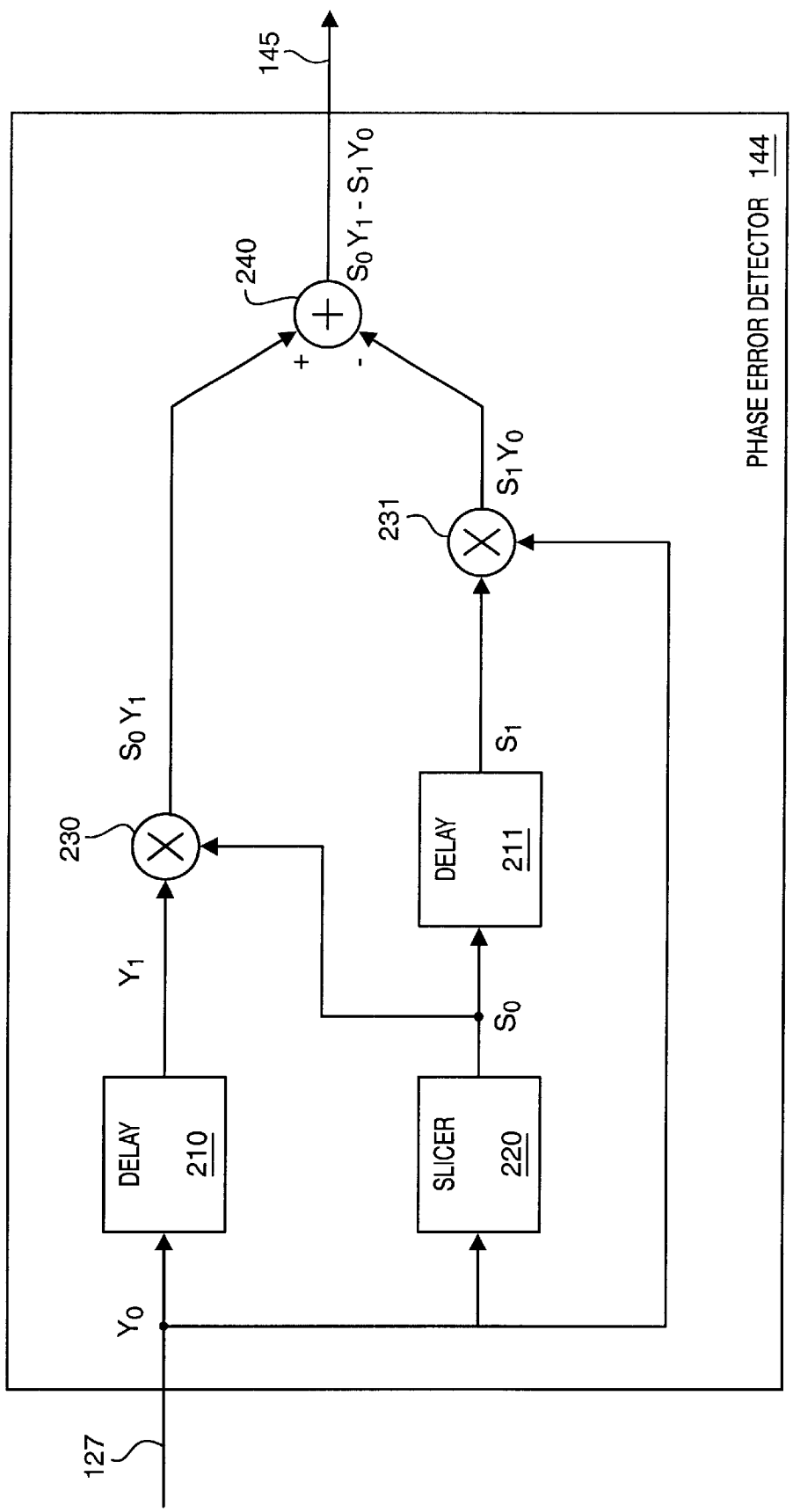
FIG. 2 is a block diagram that illustrates a phase error detector in the prior art.
Figure 3:
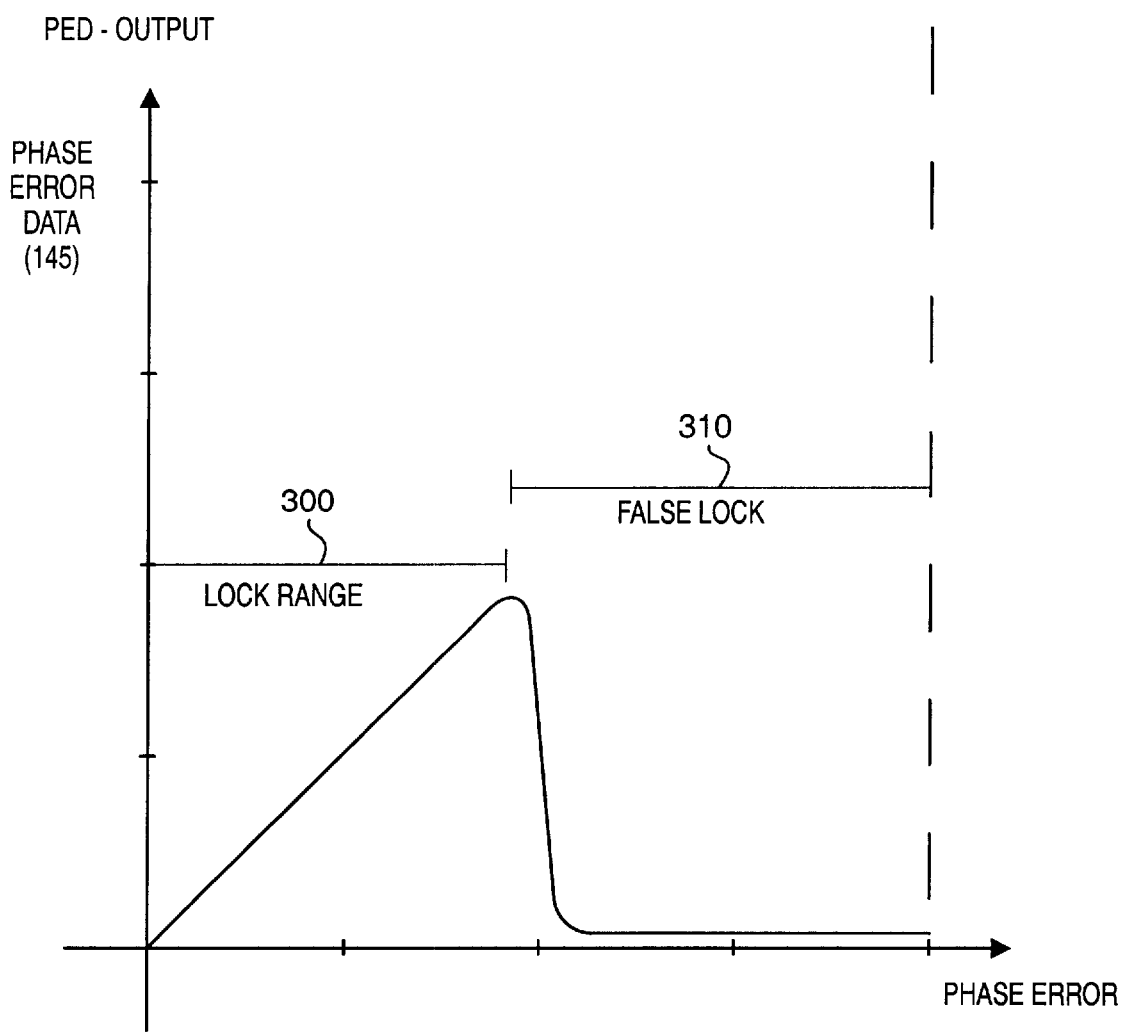
FIG. 3 is a graph depicting an example of the output of a phase error detector in the prior art.

FIG. 6 shows an example of the output of the phase error detector 444. The lock range 600 indicates the amount of phase error that can be corrected by the phase lock loop 440. Although FIGS. 3 and 6 are provided for illustrative purposes and do not portray actual data, a comparison of FIGS. 3 and 6 demonstrates that the lock range 600 of the phase lock loop 440 is much larger than the lock range 300 in the prior art. Because of the increased lock range 600, the phase lock loop 440 does not experience false lock as frequently as in prior systems. While the prior systems experience false lock 310, the phase error detector 444 still operates in the lock range 600. The phase error detector 444 is a significant advance in the art because it determines phase error over a larger lock range 600 and does not experience false lock.

The improved performances of the phase error detector 444 means that the read channel circuit 420 more accurately converts the read signal 410 into the data signal 431. The read channel circuit 420 makes for a more reliable disk drive system 400. The disk drive system 400 is a significant advantage over the prior art because it less prone to introduce errors into the data.

Those skilled in the art will appreciate variations of the above-described embodiments that fall within the scope of the invention. As a result, the invention is not limited to the specific examples and illustrations discussed above, but only by the following claims and their equivalents.

We claim:

1. A disk drive system comprising:
a disk device configured to read a storage media and transfer a corresponding read signal; and
control circuitry configured to receive and sample the read signal to generate read samples, interpolate the read samples to generate interpolated samples including a first interpolated sample and a second interpolated sample, subtract the second interpolated sample from the first interpolated sample to generate a first result, subtract the first interpolated sample from the second interpolated sample to generate a second result, slice the second result to generate a third result, multiply the first result and the third result to generate phase error data, synchronize the interpolated samples using the phase error data, and detect encoded signals in the interpolated samples.

2. The disk drive system in claim 1 wherein the control circuitry is further configured to synchronize the interpolated samples with a detector clock.

3. The disk drive system in claim 1 wherein the control circuitry is further configured to adaptively filter the read samples.

4. The disk drive system in claim 1 wherein the control circuitry is further configured to decode the encoded signals into a data signal.

5. The disk drive system in claim 1 wherein the control circuitry is further configured to filter the phase error data.

6. The disk drive system in claim 1 wherein the control circuitry is further configured to accumulate the phase error data.

7. The disk drive system in claim 1 wherein the control circuitry is further configured to decimate the first result and the third result.

8. A read channel circuit comprising:
a sampling circuit configured to receive and sample a read signal to generate read samples;
an adaptive filter configured to shape the read samples to generate equalized samples;
an interpolated timing recovery (I.T.R.) circuit configured to receive and interpolate the equalized samples to generate interpolated samples including a first interpolated sample and a second interpolated sample, subtract the second interpolated sample from the first interpolated sample to generate a first result, subtract the first interpolated sample from the second interpolated sample to generate a second result, slice the second result to generate a third result, multiply the first result and the third result to generate phase error data, and synchronize the interpolated samples using the phase error data;

a detector configured to receive the interpolated samples and detect encoded signals in the interpolated samples; and a decoder configured to receive the encoded signals and decode the encoded signals into a data signal.

9. The read channel circuit in claim 8 wherein the I.T.R. circuit is further configured to synchronize the interpolated samples with the detector clock.

10. The read channel circuit in claim 8 wherein the I.T.R. circuit is further configured to filter the phase error data.

11. The read channel circuit in claim 8 wherein the I.T.R. circuit is further configured to accumulate the phase error data.

12. The read channel circuit in claim 8 wherein the I.T.R. circuit is further configured to decimate the first result and the third result.

13. An interpolated timing recovery (I.T.R.) circuit comprising:

an interpolator configured to receive read samples, interpolate the read samples using accumulated phase error data to generate interpolated samples including a first interpolated sample and a second interpolated sample;

a phase error detector configured to receive the first interpolated sample and the second interpolated sample, subtract the second interpolated sample from the first interpolated sample to generate a first result, subtract the first interpolated sample from the second interpolated sample to generate a second result, slice the second result to generate a third result, multiply the first result and the third result to generate the phase error data, and transfer the phase error data;

a filter configured to receive and digitally filter the phase error data to generate filtered phase error data; and an accumulator configured to receive and accumulate the filtered phase error data to generate the accumulated phase error data for the interpolator.

14. The I.T.R. circuit in claim 13 wherein the interpolator is further configured to synchronize the interpolated samples with a detector clock.

15. The I.T.R. circuit in claim 13 wherein the phase error detector is further configured to decimate the first result and the third result.

16. A phase error detector configured to receive a first interpolated sample and a second interpolated sample and comprising:

a first subtractor configured to subtract the second interpolated sample from the first interpolated sample to generate a first result;

a second subtractor configured to subtract the first interpolated sample from the second interpolated sample to generate a second result;

a slicer configured to slice the second result to generate a third result; and a multiplier configured to multiply the first result and the third result to generate phase error data.

17. The phase error detector in claim 16 further including a decimator configured to decimate the first result and the third result.

18. A method of operating a disk drive system, the method comprising:

transferring a read signal;

sampling the read signal to generate read samples;

interpolating the read samples to generate interpolated samples including a first interpolated sample and a second interpolated sample;

subtracting the second interpolated sample from the first interpolated sample to generate a first result;

subtracting the first interpolated sample from the second interpolated sample to generate a second result;

slicing the second result to generate a third result;

multiplying the first result and the third result to generate phase error data;

synchronizing the interpolated samples using the phase error data; and detecting encoded signals in the interpolated samples.

19. The method in claim 18 further including synchronizing the interpolated samples with a detector clock.

20. The method in claim 18 further including adaptively filtering the read samples.

21. The method in claim 18 further including decoding the encoded signals into a data signal.

22. The method in claim 18 further including filtering the phase error data.

23. The method in claim 18 further including accumulating the phase error data.

24. The method in claim 18 further including decimating the first result and the third result.

25. A method of operating a read channel circuit, the method comprising:

receiving a read signal;

sampling the read signal to generate read samples;

interpolating the read samples to generate interpolated samples including a first interpolated sample and a second interpolated sample;

subtracting the second interpolated sample from the first interpolated sample to generate a first result;

subtracting the first interpolated sample from the second interpolated sample to generate a second result;

slicing the second result to generate a third result;

multiplying the first result and the third result to generate phase error data;

synchronizing the interpolated samples using the phase error data; and detecting encoded signals in the interpolated samples.

26. The method in claim 25 further including synchronizing the interpolated samples with a detector clock.

27. The method in claim 25 further including adaptively filtering the read samples.

28. The method in claim 25 further including decoding the encoded signals into a data signal.

29. The method in claim 25 further including filtering the phase error data.

30. The method in claim 25 further including accumulating the phase error data.

31. The method in claim 25 further including decimating the first result and the third result.

32. A method of operating an interpolated timing recovery (I.T.R.) circuit, the method comprising:

receiving read samples;

interpolating the read samples using phase error data to generate interpolated samples including a first interpolated sample and a second interpolated sample;

subtracting the second interpolated sample from the first interpolated sample to generate a first result;, subtracting the first interpolated sample from the second interpolated sample to generate a second result;

slicing the second result to generate a third result; and multiplying the first result and the third result to generate the phase error data.

33. The method in claim 32 further including synchronizing the interpolated samples with a detector clock.

34. The method in claim 32 further including filtering the phase error data.

35. The method in claim 32 further including accumulating the phase error data.

36. The method in claim 32 further including decimating the first result and the third result.

37. A method of operating a phase error detector, the method comprising:

receiving a first interpolated sample and a second interpolated sample;

subtracting the second interpolated sample from the first interpolated sample to generate a first result;

subtracting the first interpolated sample from the second interpolated sample to generate a second result;

slicing the second result to generate a third result; and multiplying the first result and the third result to generate phase error data.

38. The method in claim 37 further including decimating the first result and the third result.

* * * * *